United States Patent [19]

Horie

[11] 4,122,481
[45] Oct. 24, 1978

[54] SEMICONDUCTOR IC STRUCTURE INCLUDING ISOLATED DEVICES IN A SINGLE SUBSTRATE AND METHOD FOR FABRICATING SAME

[75] Inventor: Noboru Horie, Kodaira, Japan

[73] Assignee: Hitachi, Ltd., Japan

[21] Appl. No.: 809,105

[22] Filed: Jun. 22, 1977

[30] Foreign Application Priority Data

Jun. 23, 1976 [JP] Japan ................................. 51-73180

[51] Int. Cl.$^2$ ................................. H01L 27/02
[52] U.S. Cl. ................................. 357/43; 357/42; 357/44; 357/46; 357/48
[58] Field of Search .............. 357/42, 43, 46, 48, 357/44

[56] References Cited

U.S. PATENT DOCUMENTS

| | | | |
|---|---|---|---|
| 3,838,440 | 9/1974 | McCoffrey | 357/43 |
| 4,016,596 | 4/1977 | Mazdo | 357/43 |
| 4,032,372 | 6/1977 | Vora | 148/175 |
| 4,032,962 | 6/1977 | Balyoz | 357/68 |
| 4,076,556 | 2/1978 | Agroz-Guerena | 148/1.5 |

Primary Examiner—Martin H. Edlow
Attorney, Agent, or Firm—Craig & Antonelli

[57] ABSTRACT

A semiconductor IC structure including a plurality of isolated devices in a single substrate of a first conductivity type comprising at least three wells of a second conductivity type formed in the substrate, two of the wells reaching different edges of a buried layer of the second conductivity type at the bottom of the substrate to define a first zone of the first conductivity type in the substrate and the other wells defining at least one second zone of the first conductivity type in the substrate, and a method of fabricating a semiconductor IC structure of the above-mentioned type.

2 Claims, 10 Drawing Figures

SEMICONDUCTOR IC STRUCTURE INCLUDING ISOLATED DEVICES IN A SINGLE SUBSTRATE AND METHOD FOR FABRICATING SAME

This invention relates to a semiconductor integrated circuit structure and a method of fabricating the same. More particularly, this invention is directed to a semiconductor integrated circuit structure of the kind in which an IIL (Integrated-Injection Logic) device and an MOSFET (Insulated Gate Field Effect Transistor) are formed in the same semiconductor substrate.

As is well known, an IIL device includes a combination of a vertical type bipolar transistor in inverse arrangement and a lateral type bipolar transistor in base-grounded configuration, the former serving as an inverter while the latter serving as a constant current source for the former. The IIL device is described, for example, in U.S. Pat. No. 3,736,477 or in U.S. Pat. No. 3,816,758. The IIL device usually provides the following advantages:

(1) It consumes a very small amount of power since the inverter transistor is driven with a very low current from the constant current source transistor.

(2) It can be integrated with a high density of integration since electrical isolation between the inverter transistor of the lateral type and the constant current source transistor of the inverted vertical type is unnecessary, and these transistors include the regions common to each other. Therefore, it is suitable for making a logic circuit in large scale like that provided by MOSFETs.

(3) The operating speed of the IIL device is higher than that of an MOSFET.

Meanwhile, a complementary MOS device (a CMOS device) includes, as is also well known, in its basic construction, a series connection of P-channel enhancement mode FET and an N-channel enhancement mode FET, an input terminal connected in common with the gates of the both FETs, and an output terminal connected with the juncture of the FETs. The CMOS device provides the following advantages:

(1) It has a large input impedance.

(2) It consumes little power since it is considered to be open-circuited DC-wise.

The IIL device and the CMOS device having their individual advantages as described above, it is often considered useful to form a semiconductor IC device incorporating these devices to take full advantage of them. For example, in an IC device for a timepiece or for a camera, a logic circuit may include CMOS devices and IIL devices may be used to drive the CMOS devices.

An object of this invention is to provide a semiconductor IC structure including a plurality of devices isolated in a single substrate.

Another object of this invention is to provide a semiconductor IC structure including at least one MOS device and an IIL device isolated in a substrate.

Another object of this invention is to provide a semiconductor IC structure including CMOS device and an IIL device isolated in a substrate.

Another object of this invention is to provide a method of fabricating such a semiconductor IC structure as mentioned above.

Other objects and advantages of this invention will be apparent from the following description of some embodiments of this invention with reference to the accompanying drawings, in which.

Figure 1:
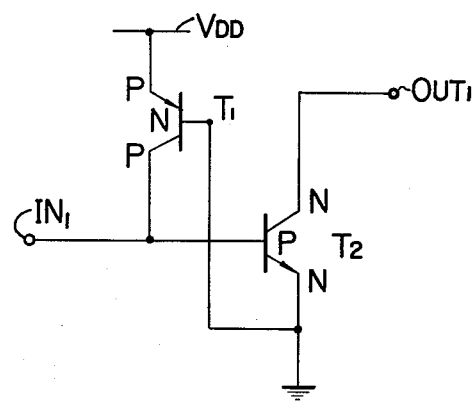
FIG. 1 is a circuit diagram of a known IIL device.

Reference is first made to FIG. 1 showing an IIL device. A PNP-type bipolar transistor $T_1$ has its base and collector connected with the emitter and the base of an NPN-type bipolar transistor $T_2$. The emitter of the transistor $T_1$ is connected with a voltage source $V_{DD}$ while the emitter of the transistor $T_2$ is grounded. The transistor $T_1$ serves as a constant current source for supplying the base of the transistor $T_2$ with a constant small current. The transistor $T_2$ is driven by the constant current source transistor $T_1$ and serves as an inverter. An input terminal $IN_1$ is connected with the base of the transistor $T_2$, and an output terminal $OUT_1$ is connected with the collector of the transistor $T_2$.

Figure 2:
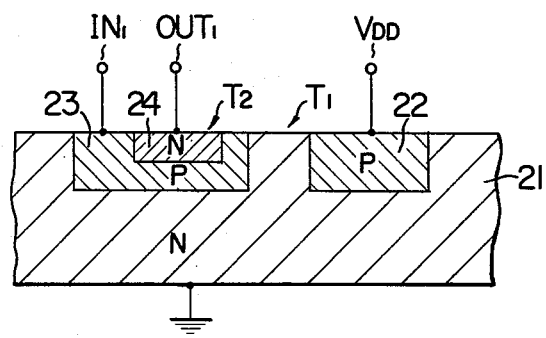
FIG. 2 is a sectional view of the structure of the device of FIG. 1.

Referring to FIG. 2 showing the construction of the IIL device shown in FIG. 1, an N-type semiconductor substrate 21 provides both the base region of the constant current source transistor $T_1$ and the emitter region of the inverter transistor $T_2$. A P-type diffused region 22 provides the emitter region of the transistor $T_1$. Another P-type diffused region 23 provides both the collector region of the transistor $T_1$ and the base region of the transistor $T_2$. An N-type diffused region 24 provides the collector region of the transistor $T_2$. Thus, the constant current source transistor $T_1$ has a lateral structure, while the inverter transistor $T_2$ has an inversed vertical structure.

Figure 3:
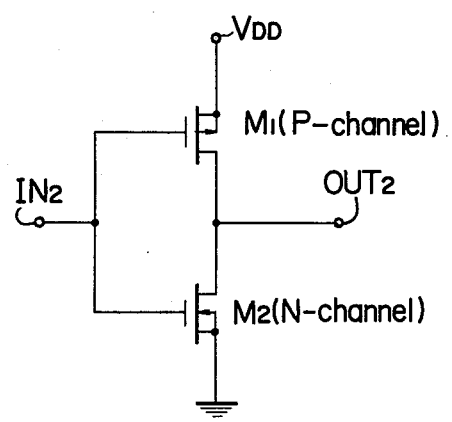
FIG. 3 is a circuit diagram of a known CMOS device.

FIG. 3 is a circuit diagram of a CMOS device which is known as a complementary inverter. A P-channel enhancement mode MOSFET $M_1$ and an N-channel enhancement mode MOSFET $M_2$ are connected in series between a voltage source terminal $V_{DD}$ and a grounded terminal, and a common input terminal $IN_2$ is connected with these FETs. An output terminal $OUT_2$ is connected with the juncture of these FETs.

Figure 4:
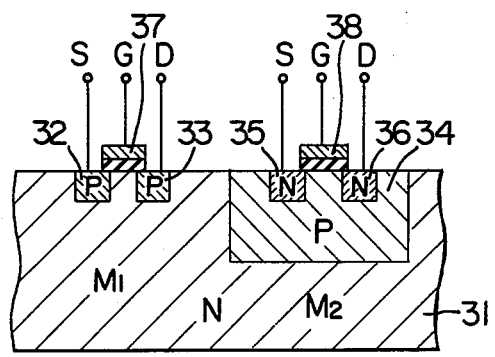
FIG. 4 is a sectional view of the structure of the device of FIG. 3.

Referring to FIG. 4 showing the construction of the CMOS device formed in the same semiconductor substrate, spaced P-type diffused regions 32 and 33 are formed in a portion of an N-type semiconductor substrate 31 to provide the source and drain respectively of the P-channel MOSFET $M_1$. The gate 37 of this MOSFET $M_1$ is disposed on an insulating film so as to overlap parts of the source and drain. a P-type well region 34 is formed in another portion of the N-type semiconductor substrate 31, and spaced N-type diffused regions 35 and 36 are formed in this well region 34 to provide the source and drain respectively of the N-channel MOSFET $M_2$. The gate 38 of this MOSFET $M_2$ is disposed on an insulating film so as to overlap parts of the source and drain.

The present inventor has attempted to incorporate the above-described IIL device and MOS device in a single substrate and encountered with the following problems.

When an N-type substrate is used, the P-type diffused regions 22 and 23 shown in FIG. 2 and the P-type well region 34 shown in FIG. 4 can be formed at the same time or in one diffusion step.

However, in the IIL device, the N-type substrate must be grounded, namely, it must be kept at a low voltage level as can be understood from FIGS. 1 and 2, while in the MOS device, the N-type substrate must be kept at a high voltage level as can be understood from FIGS. 3 and 4. If the N-type substrate is grounded, the P-type drain region in the P-channel FET will be short-circuited, and therefore the P-channel MOS device will not operate as a normal MOS device.

As the result, it is impossible simply to combine the IIL device shown in FIG. 2 and the CMOS device shown in FIG. 4. Namely, the IIL device and the CMOS device must be completely electrically isolated by an isolation region.

On the other hand, when a P-type substrate is used, as the base region 23 of the NPN inverter transistor $T_2$ forming part of the IIL device shown in FIG. 2 determines the operating characteristic of this transistor, this base region 23 must be completely electrically isolated from the other regions so as not to be affected by these regions. Therefore, it is necessary to provide an N-type well in the P-type semiconductor substrate so that the base region of the NPN transistor is formed in the well. This necessity gives rise to the need for provision of an isolation region for achieving the desired electrical isolation. However, such a semiconductor integrated circuit device requires increased diffusion steps compared with that having the two devices (CMOS and IIL devices) formed in an N-type semiconductor substrate, and the overall surface area is also increased resulting in failure of attaining the desired improvement in the density of integration.

The present invention has been made to solve the above mentioned problems.

A preferred embodiment of the present invention will now be described in detail with reference to the accompanying drawings.

FIGS. 5a to 5e are schematic sectional views showing successive steps for the fabrication of the semiconductor integrated circuit structure of the present invention by way of example.

Figure 5A:
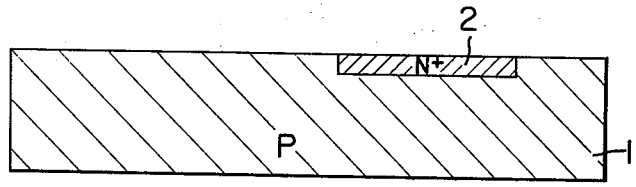
FIGS. 5a–5e are sectional views of various stages of the fabrication of a semiconductor IC structure, illustrating steps of an embodiment of this invention.

Referring first to FIG. 5a, a P-type semiconductor base layer 1 having a resistivity of 25–50 Ωcm is prepared, and antimony is diffused into a portion of the major surface of the P-type base layer 1 to form an N+-type buried layer 2 having an impurity concentration of $10^{20}/cm^3$ and a depth of about 3 μ.

Figure 5B:
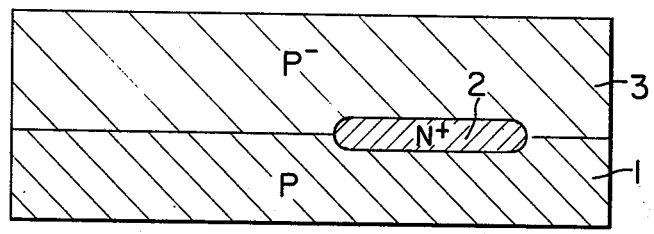

Referring to FIG. 5b, a P⁻-type layer 3 is epitaxially grown on the entire major surface of the P-type semiconductor base layer 1 by means of vapor growth to a thickness of 7–10 μ. The epitaxial layer 3 has a resistivity of 0.5–1 Ωcm, and will be called a substrate. During this step, the buried layer is expanded to the epitaxial layer or the substrate 3 by out diffusion and has a thickness of about 6 μ. As will be understood later, this buried layer 2 contributes to a definition of an isolated zone in the substrate and also serves as an emitter of an NPN transistor.

Figure 5C:
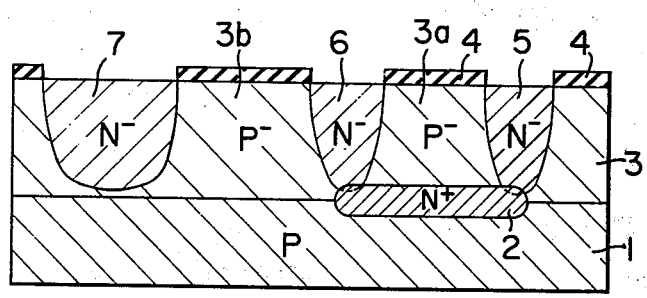

Referring to FIG. 5c, an SiO₂ film 4 is formed in an oxidizing atmosphere to a thickness of 7000–8000 Å on the entire surface of the vapor-growth layer 3, and desired portions of this SiO₂ film 4 are selectively removed by usual photo-etching. An N-type impurity such as phosphorus in ion form is then implanted into the exposed portions of the vapor-growth layer 3 and the implanted impurity is subjected to expansion diffusion to form a first well region 5, a second well region 6 and a third well region 7 to a depth of 5–8 μ simultaneously. The first and second well regions 5 and 6 thus formed extend to reach different edges of the N+-type buried layer 2 thereby to define a first P-type zone 3a and a second P-type zone 3b in the P-type substrate. The first P-type zone 3a serves as a base region of the NPN transistor.

Figure 5D:
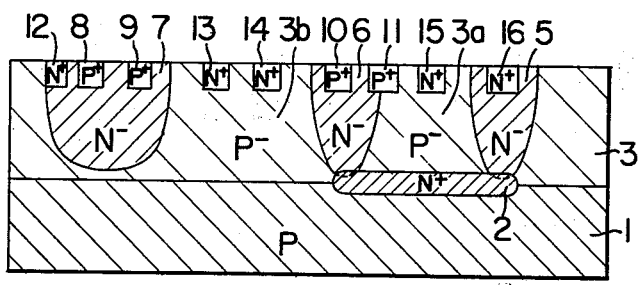

Referring to FIG. 5d, another SiO₂ film is formed on the entire surface of the vapor-growth layer 3 again, and desired portions of this SiO₂ film are selectively removed by photo-etching. Boron is diffused with the remaining SiO₂ film used as a mask to form: a pair of P+-type diffused regions 8 and 9, which serve as the source and drain respectively of a P-channel MOSFET, in the third well region 7; a P+-type diffused region 10, which serves as the emitter of a PNP transistor, in the second well region 6; and another P+-type diffused region 11, which serves as the collector of the PNP transistor (and also as the base-contact of the NPN transistor), in the boundary between the second well region 6 and the first P-type zone 3a in the vapor-growth layer 3. The P+-type regions 8–11 have an impurity concentration of $10^{20}/cm^3$ and a depth of 3 μ. The P+-type region 11 may be formed in the first P-type zone 3a, but by disposing the region 11 in the boundary as illustrated, controll of the base width of the PNP transistor is facilitated. Another SiO₂ film is then formed on the entirue surface of the vapor-growth layer 3, and desired portions of this SiO₂ film are selectively removed by photo-etching. Phosphorus is diffused with the remaining SiO₂ film used as a mask to form: an N³⁰-type region 12, which serves as a substrate electrode leader for th e P-channel MOSFET, in the third well region 7; a pair of N+-type diffused regions 13 and 14, which serve as the source and drain of the N-channel MOSFET, in the second P-type zone 3b in the vapor-growth layer 3; an N+-type diffused region 15, which serves as the collector of the NPN transistor, in the first P-type zone 3a in the vapor-growth layer 3 defined by the first and second well regions 5 and 6 and the buried layer 2; and another N+-type diffused region 16, which serves as the base-contact of the PNP transistor (and also as the emitter-contact of the NPN transistor), in the first well region 5. The N+-type region 12 serving as the substrate electrode leader does not have to do with the present invention. The N+-type regions 12–16 have an impurity concentration of $10^{21}/cm^3$ and a depth of 1–2 μ.

Figure 5E:
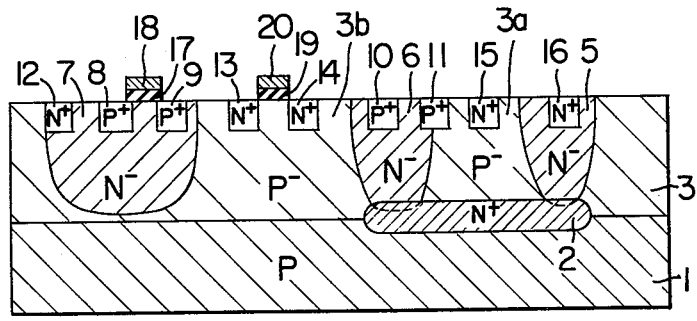

Referring to FIG. 5e, a gate 18 is formed on an insulating film 17 so as to overlap the P+-type diffused regions 8 and 9 for the P-channel MOSFET. Similarly, a gate 20 is formed on an insulating film 19 so as to overlap the N+-type diffused regions 13 and 14 for the N-channel MOSFET. The gates 18 and 19 may be formed by vacuum evaporation of aluminum or by chemical vapor-deposition of silicon.

Figure 6:
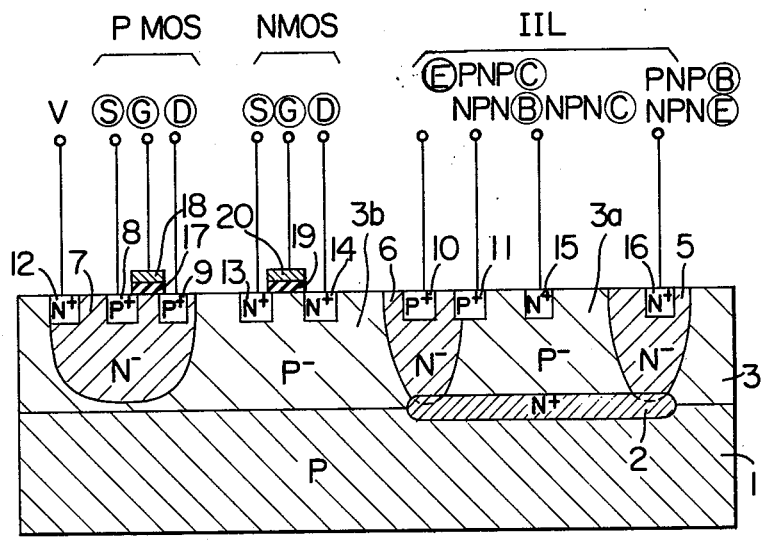
FIG. 6 is a sectional view showing a completed structure through the steps of FIGS. 5a–5e.

Finally, source electrodes S, gate electrodes G, drain electrodes D, emitter electrodes E, collector electrodes C and base electrodes B are provided as shown in FIG. 6. Those electrodes are formed by vacuum evaporation of aluminum.

According to the present invention described in detail hereinbefore, the following advantages are provided:

The inverter transistor in the IIL device has its base consituted by an epitaxially grown region, 3a, which has a uniform impurity concentration, so that $h_{FE}$ of the transistor is improved as compared with that of the inverter transistor in the conventional IIL device, because conventionally the base of the inverter transistor has such a gradient of impurity concentration as is adverse to motion of injected carries due to the inverse arrangement of the regions of the inverter transistor;

The IIL device is completely electrically isolated by the well regions 5, 6 and the buried layer 2 from the regions including the P-channel and N-channel MOSFETs, so that the operating characteristics of the IIL device are not influenced by the CMOS devices;

The well regins 5, 6 have the dual function of electrically isolating the IIL device from other devices for the IIL device, so that any special isolation region is unnecessary and the MOSFETs can be formed in close proximity to the IIL device, thereby attaining the desired improvement in the density of integration; and The fabricating steps need not be particularly increased due to the fact that the well region for providing the P-channel or N-channel MOSFET and the well regions for providing the IIL device can be simultaneously formed.

The present invention is in no way limited to the aforementioned specific embodiment, and various changes and modifications may be made therein. For example, although the embodiment has referred to the combination of an IIL device and a CMOS device, an IIL device may merely be combined with a P-channel MOSFET or an N-channel MOSFET in lieu of the above combination. Further, the conductivity types of the layers and regions may be entirely opposite to those illustrated.

Those skilled in the art will appreciate that the present invention finds broad applications to various combinations of IIL devices and MOSFETs.

I claim:

1. A semiconductor IC structure including a plurality of devices formed in a substrate and isolated from one another, comprising:
   a semiconductor base layer for a first conductivity type;
   a semiconductor substrate of the first conductivity type epitaxially formed on said base layer;
   a buried layer of a second conductivity type formed in the boundary between said substrate and said base layer;
   first and second wells of the second conductivity type extending from one surface of said substrate to reach different edges of said buried layer to define an isolated first zone of the first conductivity type in said substrate;
   at least one third well of the second conductivity type extending from said one surface of said substrate;
   an emitter- and base-contact region of the second conductivity type formed in said first well;
   a collector region of the second conductivity type formed in said first zone, said buried layer and said first zone serving as emitter and base regions, respectively;
   a base-contact and collector region of the first conductivity type formed in said second well;
   an emitter region of the first conductivity type formed in said second well, said second well serving as a base region;
   a drain region and a source region both of the first conductivity type formed in a spaced relation in one of said at least one third well; and
   a first gate formed on a first insulating layer on the surface of said one third well;
   whereby at least an IIL device and a first conductivity type channel MOS device are constituted in said substrate.

2. A structure according to claim 1, further comprising: drain and source regions of the second conductivity type formed in a spaced relation in one of the at least one second zone of the first conductivity type in said substrate between said wells and a second gate formed on a second insulating layer on the surface of said one second zone between said drain and source regions, thereby constituting a second conductivity type channel MOS device is said substrate.

* * * * *